United States Patent
Tews et al.

(10) Patent No.: US 6,261,972 B1
(45) Date of Patent: Jul. 17, 2001

(54) DUAL GATE OXIDE PROCESS FOR UNIFORM OXIDE THICKNESS

(75) Inventors: Helmut Horst Tews, Poughkeepsie; Mary Weybright, Pleasant Valley; Stephan Kudelka, Fishkill; Oleg Gluschenkov, Hopewell Junction; Suri Hegde, New York, all of NY (US)

(73) Assignees: Infineon Technologies AG, Munich (DE); International Business Machines, Armonk, NY (US)

( * ) Notice: Subject to any disclaimer, the term of this patent is extended or adjusted under 35 U.S.C. 154(b) by 0 days.

(21) Appl. No.: 09/706,641

(22) Filed: Nov. 6, 2000

(51) Int. Cl.[7] .................................................. H01L 21/00
(52) U.S. Cl. ........................ 438/766; 438/981; 438/258; 438/241
(58) Field of Search .................................. 438/981, 258, 438/264, 241, 766

(56) References Cited

U.S. PATENT DOCUMENTS

| | | | |
|---|---|---|---|
| 5,254,489 | * | 10/1993 | Nakata . |
| 5,330,920 | * | 7/1994 | Soleimani et al. . |
| 5,498,577 | * | 3/1996 | Fulford, Jr. et al. . |
| 5,672,521 | * | 9/1997 | Barsan et al. . |
| 5,861,347 | * | 1/1999 | Maiti et al. .......................... 438/787 |
| 5,937,310 | * | 8/1999 | Gardner et al. ...................... 438/440 |
| 6,091,109 | * | 7/2000 | Hasegawa ............................ 257/339 |
| 6,110,842 | * | 8/2000 | Okuno et al. ........................ 438/776 |
| 6,147,008 | * | 11/2000 | Chwa et al. .......................... 438/762 |
| 6,150,220 | * | 11/2000 | Huh et al. ............................ 438/275 |

* cited by examiner

Primary Examiner—Richard Booth
(74) Attorney, Agent, or Firm—Stanton C. Braden

(57) ABSTRACT

A process for forming dual gate oxides of improved oxide thickness uniformity for use in high performance DRAM systems or logic circuits, comprising:
a) growing a sacrificial oxide layer on a substrate;
b) implanting a dopant through the sacrificial oxide layer;
c) implanting a first dosage of nitrogen ions in the absence of a photoresist to form a nitrided silicon layer;
d) subjecting the substrate to a rapid thermal anneal for a sufficient time and at a sufficient temperature to allow nitrogen to diffuse to the silicon/oxide interface;
e) masking the substrate with a photoresist to define the locations of the thin oxides of the dual gate oxide;
f) implanting a second dosage of nitrogen ions through the photoresist;
g) stripping the photoresist and the sacrificial oxide layers; and
h) growing by oxidation gate oxide layers characterized by improved oxide thickness uniformity in the nitrogen ion implanted areas in the thin and thick oxides.

12 Claims, 2 Drawing Sheets

DUAL GATE OXIDE PROCESS FOR UNIFORM OXIDE THICKNESS

BACKGROUND OF THE INVENTION

1. Field of the Invention

The invention relates to semiconductor processing, and in particular, a dual gate oxide process for high performance DRAM systems or logic circuits, in which the oxide thicknesses are of greater uniformity.

2. Description of the Related Art

In high performance DRAM systems or logic circuits, it is necessary to integrate Dual Gate Oxide (DGO) thicknesses into a single integrated circuit device.

One reason for performing dual gate oxide processing is due to the fact that high performance transistors require thinner gate dielectric regions and operate at lower voltages from about 1.4 to 2.5 volts, whereas most common external peripherals require higher operating voltages of from about 3.3 to 5.0 volts.

One typical way to achieve two oxide thicknesses in one oxidation step is to make use of local nitrogen implantation to reduce the oxidation rate at the implanted sites.

The use of local nitrogen implementation to achieve two oxidation thicknesses in one oxidation step consist of utilizing the process integration scheme of:

growing of the sacrificial oxide;

implantation of dopants through the sacrificial oxide;

employing a photoresist mask to pattern an integrated circuit that includes the first transistor having a first dielectric thickness and a second transistor having a second dielectric thickness;

implanting nitrogen ions to create dual gate oxide devices;

stripping off the photoresist mask and the sacrificial oxide; and subjecting the gate to oxidation.

However, the foregoing integration scheme for providing a dual gate oxide process necessary for use in high performance DRAM systems or logic circuits yields two oxide gates of different thicknesses but without sufficient thickness uniformity and with only thin oxide nitrided.

U.S. Pat. No. 5,960,289 discloses a method for making a dual thickness gate oxide layer using a nitride/oxide composite region. The process entails:

providing a substrate having first and second active areas separated by an isolation region;

forming a first oxide layer over both the first and second active areas;

forming a protection layer over the first oxide layer;

masking the protection layer overlying the first active area;

etching the protection layer and the first oxide layer overlying the second active area while the masking layer protects the first oxide layer and the protection layer overlying the first active area;

forming a second oxide layer overlying the second active area where the protection layer prevents oxidation in the first active area; and forming conductive gate electrodes over the first and second active areas wherein a composite of the protection layer and the first oxide layer forms a gate dielectric for conductive gate electrodes in the first active area and the second oxide layer forms a gate dielectric for conductive gate electrodes in the second active area.

The step of forming the protection layer may comprise exposing the semiconductor to an ambient comprising a silicon-containing gas and a nitrogen-containing gas to form the protective layer; and exposing the protection layer to a $N_2$ anneal ambient.

A process for making a dual gate oxide thickness integrated circuits is disclosed in U.S. Pat. No. 6,033,943. The process comprises:

providing a semiconductor wafer, in which the wafer includes a semiconductor substrate comprising a first region and a second region laterally displaced from the first region;

forming a first dielectric layer on an upper surface of the semiconductor substrate, wherein the first dielectric layer has a first thickness;

depositing a masking layer on the first dielectric layer and patterning the masking layer to expose the first dielectric layer above the second region of the semiconductor substrate;

while retaining a portion of the first dielectric layer above the entirety of the second region, subjecting the wafer to an oxygen bearing ambient at a temperature of 700° C. to 1000° C. such that a second dielectric layer is formed over the second region of the semiconductor substrate, wherein the second layer has a second thickness, and further wherein the second thickness is unequal to the first thickness;

removing the masking from the upper surface of the first dielectric layer, subsequent to the subjecting step;

forming first and second gate structures on upper surfaces of the first dielectric layer and the second dielectric layer respectively; and introducing impurities into a first and second pair of source/drain regions laterally displaced on either side of the first and second channel regions respectively whereby first and second transistors are formed, wherein the dielectric layer serves as a gate dielectric for the transistor and the second dielectric layer serves as a gate dielectric for the second transistor.

U.S. Pat. No. 5,863,819 disclose a method for fabricating a DRAM access transistor with dual gate oxide technique. The steps include:

stripping a pad oxide and growing a sacrificial oxide layer; masking the sacrificial oxide layer with a photoresist to protect the area where the memory array will be formed;

stripping the sacrificial oxide not protected by the photoresist;

stripping the photoresist; and growing a gate oxide layer which is thinner than the sacrificial oxide layer.

A method for manufacturing a dual gate oxide layer which can be applied to the surface of a shallow trench isolation structure is disclosed in U.S. Pat. No. 5,985,725. The method entails:

providing a substrate with a device isolation structure thereon;

forming an oxide layer over the substrate and the device isolation structure;

forming a silicon nitride layer over the oxide layer; and patterning the silicon nitride layer so that portions of the oxide layer are covered by the silicon nitride layer and portions of the oxide layer are exposed, wherein the oxide layer covered by a silicon nitride layer defines an input/output device area, whereas the oxide layer not covered by a silicon nitride layer defines a core device area, wherein the patterning of the silicon nitride layer further includes:

defining the silicon nitride layer covered input/output device area as a first gate oxide layer; and defining the silicon nitride layer-free core device area as a second gate oxide layer, and wherein the first gate oxide layer includes a silicon nitride/oxide stack.

U.S. Pat. No. 6,063,670 disclose a method for fabricating an integrated circuit of multiple gate dielectric thicknesses comprising:

forming a first gate dielectric layer over a semiconductor body;

forming a first disposable layer over the first gate dielectric layer, said first disposable layer comprising a material selectively etchable with respect to the first gate dielectric layer and the semiconductor body;

forming a pattern over the first disposable layer, said pattern covering a first region of the disposable layer and exposing a second region of the disposable layer;

removing at least a portion of the first disposable layer in the second region using said pattern;

removing the pattern while the substrate is not exposed;

removing at least a portion of the first gate dielectric layer in the second region; and subsequent to removing the pattern, forming a second gate dielectric layer in the second region, said second gate dielectric layer having a thickness different from the first dielectric layer.

A method of manufacturing a semiconductor device of dual gate oxide formation with minimal channel dopant diffusion is disclosed in U.S. Pat. No. 6,030,862. The process comprises:

forming a field oxide region to isolate an active area on a main surface of a semiconductor substrate;

formine a first gate dielectric layer on the active area, implanting impurities into the substrate through the first gate dielectric layer;

forming a mask on the first gate dielectric layer, the mask having openings over portions of the active area;

etching the first gate dielectric layer to expose the portions of the active area; and forming a second gate dielectric layer on the exposed portions of the active area to a thickness less than a thickness of the first gate dielectric layer, wherein the first gate dielectric layer is formed to a first thickness in an approximately 20% oxygen atmosphere at about 800° C. to about 1000° C. for about 20 seconds to about 10 minutes and wherein said second gate dielectric layer is formed to a second thickness in an approximately 50% $N_2O$ atmosphere at about 800 ° C. to about 1000° C. for about 2 minutes to about 45 minutes.

Accordingly, there is a need in the art of providing dual gate oxide technology for high performance DRAM systems and logic circuits to obtain two oxide thicknesses in one oxidation step through the use of local nitro-en implantation, to provide channel implant anneal for the dual gate process and to improve gate oxide thickness uniformity.

SUMMARY OF THE INVENTION

One object of the present invention is to provide a dual gate oxide process for high performance DRAM systems and logic circuits that provide an anneal step for implanted dopant atoms in the gate dielectric layer.

Another object of the present invention is to provide a dual gate oxide process for high performance DRAM systems or logic circuits in which there is nitridation of the gate dielectric oxide layer to impart improved oxide hot carrier properties.

A further object of the present invention is to provide a dual gate oxide process for high performance DRAM systems or logic circuits in which there is improved oxide thickness uniformity.

In general, the dual gate oxide process of the invention for high performance DRAM systems or logic circuits is accomplished by: growing a sacrificial oxide on a substrate;

implanting dopants through the sacrificial oxide layer;

implanting nitrogen ions without a mask into substrate regions;

subjecting the wafer to a rapid thermal annealing step;

masking the substrate with a photoresist to define locations of the thin oxides of the dual gate oxide;

providing a second implantation of nitrogen through the resist mask;

stripping off the resist mask and sacrificial oxide; and growing by oxidation gate oxide layers characterized by improved oxide thickness uniformity in the nitrogen implanted area.

DETAILED DESCRIPTION OF THE INVENTION

The invention propounds a method for forming a dual gate oxide structure to support gate oxide devices on a single integrated or logic circuit used in DRAM systems.

The dual gate oxide process of the invention is commenced by first forming a sacrificial oxide layer of $SiO_2$ on a silicon substrate by oxidation. Thereafter, dopants such as p-type impurities of boron or dopants such as n-type impurities (phosphorous or arsenic) are implanted by ion implantation through the sacrificial oxide. Next, a first implantation of nitrogen ions ($N_2^+$) or $N^+$ ions is implanted into the silicon substrate.

In general, the nitrogen ion dosage may range from between about $10^{13}$ and $10^{15}$ ions per $cm^2$ and the energy may range from between about 5 keV and 100 keV. After nitrogen ion implantation is completed, the wafer is subjected to a rapid thermal anneal for about 10 seconds at a temperature of from 800° C. to about , 1,100° C. for a period of from about 1 to 60 seconds, and preferably at about 950° C. for about 10 seconds. During this rapid thermal annealing step, the nitrogen diffuses to the silicon/oxide interface.

Following the rapid thermal anneal step, the substrate is masked with a photoresist, after which a second nitrogen ion implantation is affected through the resist mask under ion implantation conditions comparable to the first implantation of nitrogen without the resist mask. This mask defines the locations of the thin oxides of the dual gate oxide.

Next, the photoresist and the sacrificial oxide are stripped.

Finally, oxidation is affected to grow the gate oxide layers characterized by improved oxide thickness uniformity in the nitrogen ion implanted area.

In another embodiment, a maskless implantation of nitrogen ions is made through 75 Å sacrificial oxide. The projected range of the implantation is 200 Å. After the nitrogen implantation, the wafers are subjected to a rapid thermal anneal under annealing conditions for 10 seconds at 950° C. Rapid thermal annealing was also affected on wafers at a 1000° C. and 1050° C.

Figure 1:
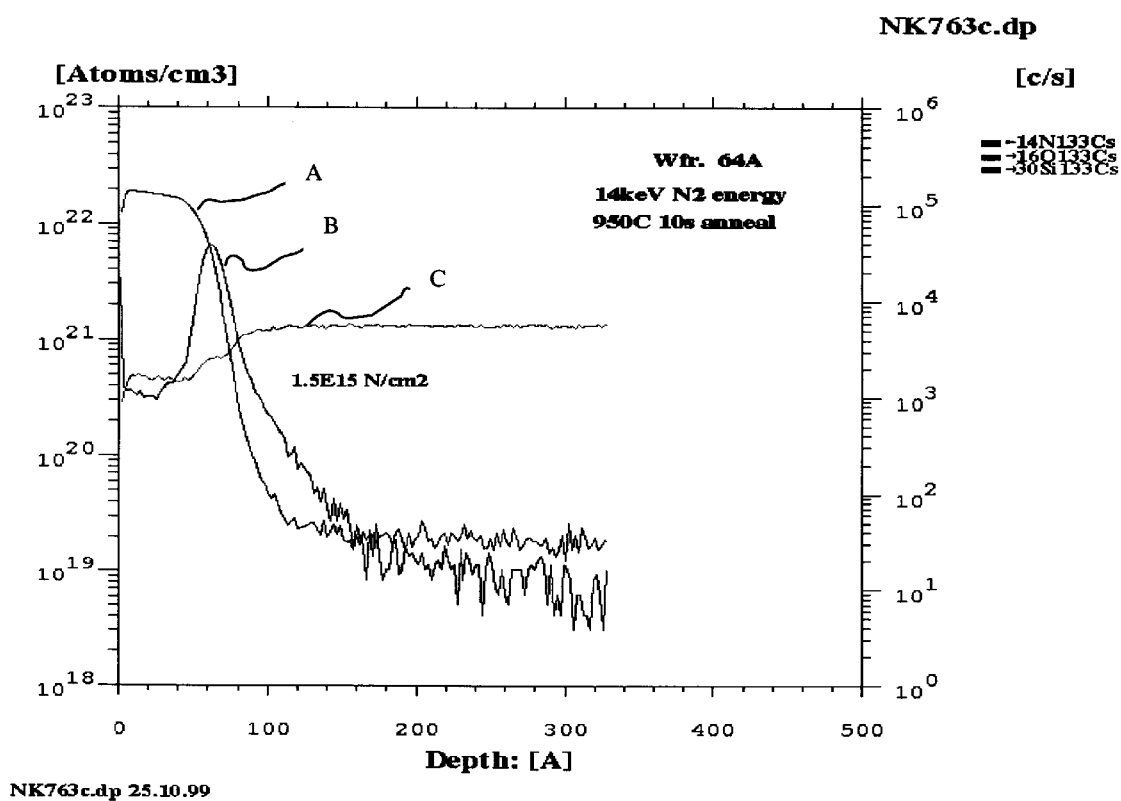
FIG. 1 is a graph showing the spacial distribution of nitrogen diffusion to the silicon/oxide interface during annealing for 10 seconds at 950° C.

During the annealing step, the nitrogen diffuses to the silicon/oxide interface. In this connection, reference is made to FIG. 1 which is an X-Y plot showing the spacial distribution of nitrogen in this example, as measured using SIMS (secondary ion mass spectroscopy). The SIMS measurement data is shown for oxygen, A nitrogen, B and silicon C. The as-implanted nitrogen peak is at a depth of 200 Å, and the energy of the nitrogen is 14 KeV.

After the rapid thermal anneal (RTA), a second nitrogen implantation is performed through a photoresist mask. As mentioned, this photoresist mask defines the locations for the thin oxides of the dual gate oxide process.

The data for the thick oxides that have only been subjected to the first nitrogen ion implantation plus the rapid thermal annealing step is shown in TABLE I.

TABLE I

| WAFER | Implantation | Anneal | Sac oxide strip | Thickness (A) | Sigma (A) |
|---|---|---|---|---|---|
| 1 | yes | no | DHF | 32.01 | 0.36 |
| 2 | | | | 32.08 | 0.30 |
| 3 | yes | 950 C 10 s | DHF | 53.90 | 0.21 |
| 4 | | | | 53.97 | 0.25 |
| 5 | yes | 1000 C 10 s | DHF | 54.90 | 0.35 |
| 6 | | | | 54.79 | 0.28 |
| 7 | yes | 1050 C 10 s | DHF | 55.05 | 0.36 |
| 8 | | | | 55.13 | 0.40 |
| 9 | no | no | DHF | 55.66 | 0.50 |
| 10 | | | | 55.71 | 0.50 |
| 11 | yes | 950 C 10 s | BHF | 53.73 | 0.21 |
| 12 | | | | 53.66 | 0.22 |
| 13 | yes | 1000 C 10 s | BHF | 54.53 | 0.28 |
| 14 | | | | 54.48 | 0.20 |
| 15 | yes | 1050 C 10 s | BHF | 55.50 | 0.22 |
| 16 | | | | 54.85 | 0.35 |
| | | | | 54.39 | 0.28 |

TABLE I, in which a thick oxide has been subjected only to the first nitrogen ion plus a rapid thermal anneal, the oxidation was performed at 800° C.

TABLE I shows two groups of wafers. In the first group (wafers 1–10), the (sac) oxide was stripped using dilute HF (DHF) solution, while in the second group wafers 11–16) was stripped using buffered (BHF) solution. BHF is a mixture of $NH_4F,HF$ and $H_2O$, in which the $NH_4F:HF$ is 40:1 and wherein the HF is 49% in $H_2O$.

DHF is a mixture of HF and $H_2O$, in which $H_2O:HF$ is 200:1 and wherein the HF is 49% in $H_2O$.

TABLE I shows an oxide thickness of about 55 Å was obtained without nitrogen plantation and without the rapid thermal annealing step. On the other hand, TABLE I hows that, with the nitrogen implantation, the implanted region had an oxide thickness of bout 32 Å as a result of the nitrogen retardation of thermal oxidation in the active area. the annealed wafers show a nearly unchanged oxide thickness compared to the non-implanted wafers. Accordingly, it is clear that the nitrogen peak at the silicon/oxide interface was removed when the sacrificial oxide was stripped.

It should also be noted that a thick oxide may be grown on nitrogen implanted silicon.

As a result of the invention process, it has been found that the thickness uniformity of the thick oxides after nitrogen ion implantation plus rapid thermal annealing is significantly improved when compared to the non-implanted wafers. The thickness uniformity as measured by the ellipsometry is improved by a factor of 2. Further, a clear trend is visible with the best thickness uniformities for the lowest rapid temperature anneal at 950° C.

Figure 2:
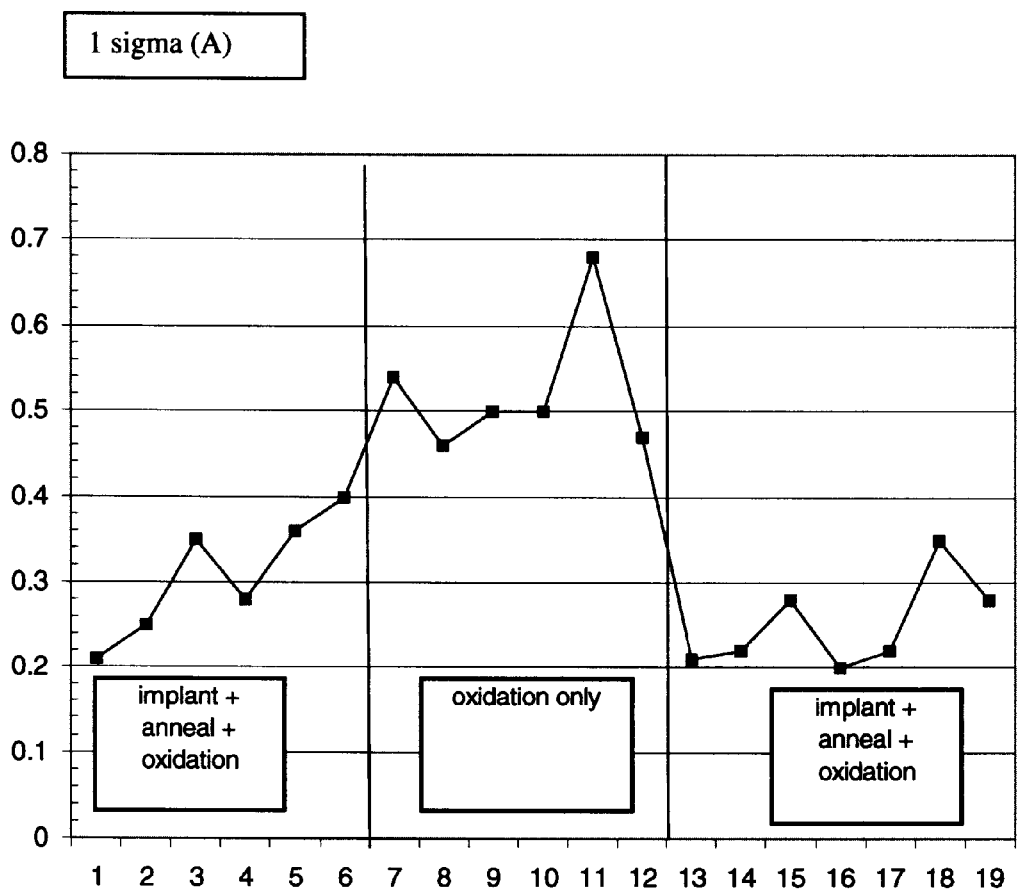
FIG. 2 is a graph showing thickness uniformities of thick oxides after nitrogen implant plus anneal, followed by oxidation.

Referring back to TABLE 1, it has been found that, in the invention process, the improvement in oxide thickness uniformity is better when using BHF for the sacrificial oxide stripping than when using DHF for the sacrificial oxide stripping, and this effect is graphically depicted in FIG. 2.

In FIG. 2., the thickness uniformity (1 Sigma) for the different processes is shown. That is, the first six wafers show the thickness uniformity trend from 950° C. to 1050° C. rapid temperature anneals, when the sac oxide strip is done using BHF. On the other hand, wafers 8 and 10 are those on which the oxidation recipes are at 800° C., while the third group of wafers, 11–16, are those on which the rapid thermal anneal step has been conducted from 950° C. to 1050° C. for 10 seconds and the sac oxide strip is done using BHF.

The improvement of oxide thickness uniformity indicates that some nitrogen is left at the silicon surface after the strip of the sac oxide, thereby leading to a more uniform oxidation process. Further, since the BHF is more selective to the nitrided silicon dioxide layer than the DHF, this superficial nitrided layer appears to be thicker than in the case when BHF is used as the strip.

We claim:

1. A process for forming thin and thick gate oxides of improved oxide thickness uniformity for use in high performance DRAM systems or logic circuits, comprising:

a) growing a sacrificial oxide layer on a silicon substrate;

b) implanting a dopant through said sacrificial oxide layer;

c) implanting a first dosage of nitrogen ions in the absence of a photoresist to form a nitrided silicon layer;

d) subjecting said nitrided silicon layer to a rapid thermal anneal for a sufficient time and at a sufficient temperature to allow nitrogen to diffuse to the silicon/oxide interface;

e) masking the substrate with a photoresist to define the locations of the thin oxides of the dual gate oxide;

f) implanting a second dosage of nitrogen ions through said photoresist;

g) stripping said photoresist and said sacrificial oxide layers; and h) growing by oxidation gate oxide layers characterized by improved oxide thickness uniformity in the nitrogen ion implanted areas of the substrate to form said thin and thick oxides.

2. The process of claim 1 wherein in step c), the nitrogen ion dosage ranges from about $10^{13}$ to $10^{15}$ ions per $cm^2$.

3. The process of claim 2 wherein energy at which said implantation proceeds ranges from about 5 keV to about 100 keV.

4. The process of claim 3 wherein in step d) said rapid thermal anneal is at a temperature of from about 800° C. to about 1,100° C.

5. The process of claim 4 wherein in step d) said rapid thermal anneal is at about 1000° C. for 10 seconds.

6. The process of claim 4 wherein in step d) said rapid thermal anneal is at about 1050° C. for 10 seconds.

7. The process of claim 4 wherein said sacrificial oxide is stripped with DHF.

8. The process of claim 5 wherein said sacrificial oxide is stripped with DHF.

9. The process of claim 6 wherein said sacrificial oxide is stripped with DHF.

10. The process of claim 4 wherein said sacrificial oxide is stripped with BHF.

11. The process of claim 5 wherein said sacrificial oxide is stripped with BHF.

12. The process of claim 6 wherein said sacrificial oxide is stripped with BHF.

* * * * *